US010777733B2

(12) United States Patent
Gilda et al.

(10) Patent No.: US 10,777,733 B2
(45) Date of Patent: Sep. 15, 2020

(54) METHOD AND APPARATUS FOR MANUFACTURING SEMICONDUCTOR DEVICE

(71) Applicant: TAIWAN SEMICONDUCTOR MANUFACTURING COMPANY LTD., Hsinchu (TW)

(72) Inventors: Neena Avinash Gilda, Hsinchu (TW); Lien-Yao Tsai, Hsinchu (TW); Baohua Niu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/202,954

(22) Filed: Nov. 28, 2018

(65) Prior Publication Data

US 2020/0168789 A1    May 28, 2020

(51) Int. Cl.
*H01L 41/257* (2013.01)
*H01L 41/319* (2013.01)
*H01L 41/313* (2013.01)

(52) U.S. Cl.
CPC .......... *H01L 41/257* (2013.01); *H01L 41/313* (2013.01); *H01L 41/319* (2013.01)

(58) Field of Classification Search
CPC .................................................... H01L 41/257
See application file for complete search history.

(56) References Cited

U.S. PATENT DOCUMENTS

| | | | |
|---|---|---|---|
| 2009/0174419 A1* | 7/2009 | Ohnishi | B41J 2/0451 324/727 |
| 2009/0236949 A1* | 9/2009 | Fujii | C23C 14/088 310/367 |
| 2010/0125988 A1* | 5/2010 | Nakamura | H01L 41/257 29/25.35 |

OTHER PUBLICATIONS

Cha et al. "A New Poling Method of High Power Generator Using PZT Ceramic", PowerMEMS Conference, Nov. 30-Dec. 3, 2010 (Year: 2010).*

* cited by examiner

*Primary Examiner* — Selim U Ahmed
*Assistant Examiner* — Evan G Clinton
(74) *Attorney, Agent, or Firm* — WPAT, P.C., Intellectual Property Attorneys; Anthony King

(57) ABSTRACT

The present disclosure provides a method for manufacturing a semiconductor device. The method for manufacturing a semiconductor device includes the following operations. An intermediate layer is formed in the semiconductor device. A voltage is applied to the intermediate layer. A unit cell of the intermediate layer is stretched or compressed by the voltage. The polarity of the intermediate layer is changed by the voltage.

20 Claims, 8 Drawing Sheets

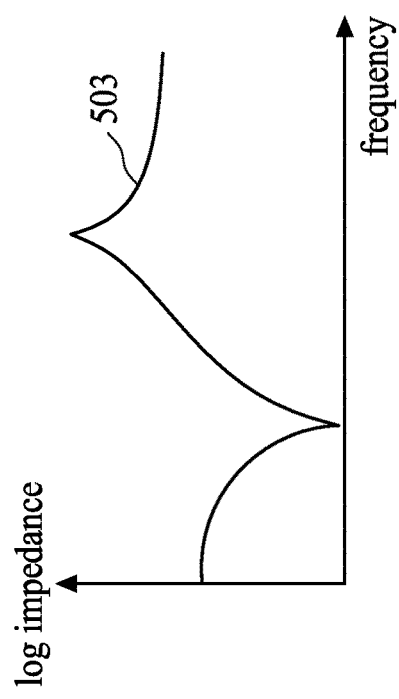
FIG. 5
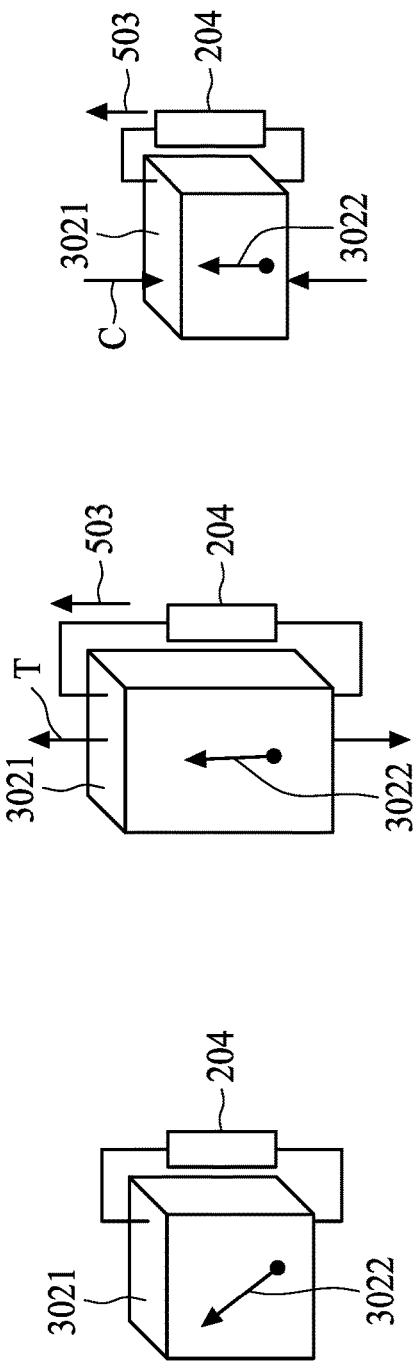
FIG. 6C
FIG. 6B
FIG. 6A

METHOD AND APPARATUS FOR MANUFACTURING SEMICONDUCTOR DEVICE

BACKGROUND

In a crystalline structure with several unit cells, dipoles are often randomly oriented. If the dipoles are randomly oriented in the crystalline structure of a piezoelectric or ferroelectric material, the piezoelectric effect exhibited by the piezoelectric or ferroelectric material will be negligible. To align the dipoles of a crystallized piezoelectric or ferroelectric material, the crystallized piezoelectric or ferroelectric material may be subjected to a process called poling so that the dipoles are oriented in a desired direction.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5 is a plot of an AC voltage showing impedance in relation to frequency in accordance with some embodiments of the present disclosure.

FIG. 6A, FIG. 6B and FIG. 6C are schematic views of the unit cell during the poling operation in accordance with some embodiments of the present disclosure.

DETAILED DESCRIPTION

Figure 1:
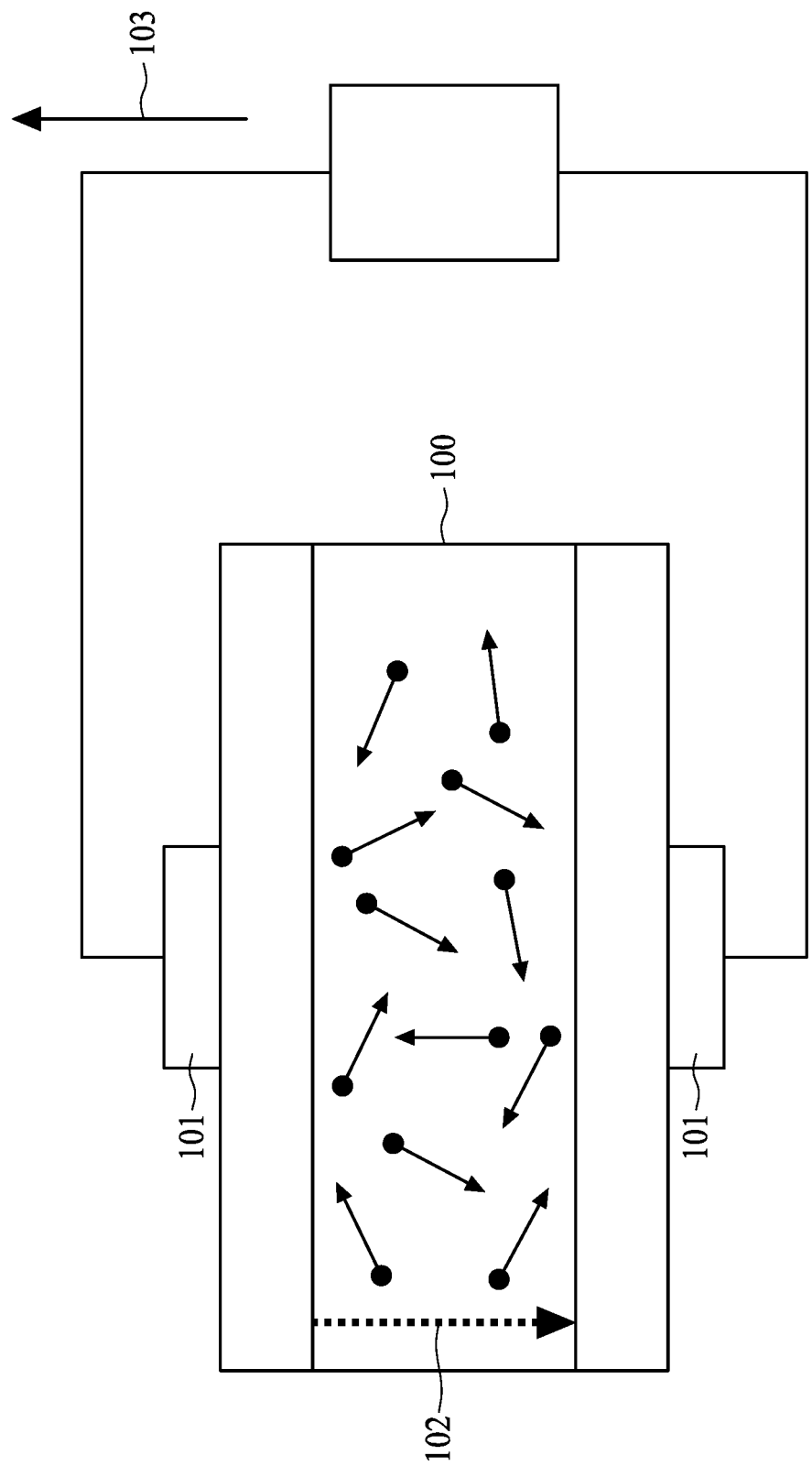
FIG. 1 is a schematic view of the dipoles oriented in random directions prior to the poling operation.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of dipoles oriented in random directions prior to a poling operation. When piezoelectric or ferroelectric materials are initially formed and crystallized, a dipole orientation of the dipoles may be random. In some cases, a piezoelectric or ferroelectric layer 100 in a semiconductor device may be polarized by a poling operation. In the existing poling operation, two separate electrodes 101 contact opposite sides of the piezoelectric or ferroelectric layer 100 of the semiconductor device and then apply a voltage 103 across the piezoelectric or ferroelectric layer 100. This causes an electric field 102 to develop within the piezoelectric or ferroelectric layer 100.

The electric field 102 is applied to the piezoelectric or ferroelectric layer 100 in one direction. Also, in some existing poling operations, the voltage 103 is a direct current (DC) voltage. The voltage 103 may be not related to structural properties of the piezoelectric or ferroelectric layer 100. Thus, if orientations of the dipoles are approximately perpendicular to the electrical field 102, the dipoles may not be affected by the electric field 102 or may be only temporarily affected. As a result, the piezoelectric or ferroelectric layer 100 may not be appropriately polarized and thus may suffer from a long-term degradation issue.

The issues mentioned above may be alleviated by the concepts of the present disclosure. Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

According to some embodiments of the present disclosure, a power supply provides a voltage corresponding to lattice properties of an intermediate layer (i.e., the piezoelectric or ferroelectric layer). For example, a frequency of the voltage corresponds to a resonant frequency of unit cells in the intermediate layer. The unit cells of the intermediate layer may be stretched by the voltage with the resonant frequency. As the unit cells are stretched, the poling operation may have a stronger effect on the intermediate layer. As a result, the intermediate layer is polarized more uniformly and efficiently when the electrical field is applied in one direction. In other words, the intermediate layer may receive the electrical energy more efficiently from the voltage with the resonant frequency. Moreover, the dipoles of the unit cells in the intermediate layer may reach a stable state due to the application of the voltage, and the degradation issue of the intermediate layer may be alleviated.

Similarly, a frequency of the voltage may correspond to an anti-resonant frequency of the unit cells in the intermediate layer. The unit cells of the intermediate layer may be compressed by the voltage with the anti-resonant frequency. As the unit cells are compressed, the poling operation may have a stronger effect on the intermediate layer. As described above, the intermediate layer may receive the electrical energy more efficiently from the voltage with the anti-resonant frequency. Also, the dipoles of the unit cells in the intermediate layer may reach a stable state due to the application of the voltage, and the degradation issue of the intermediate layer may be alleviated.

Figure 2:
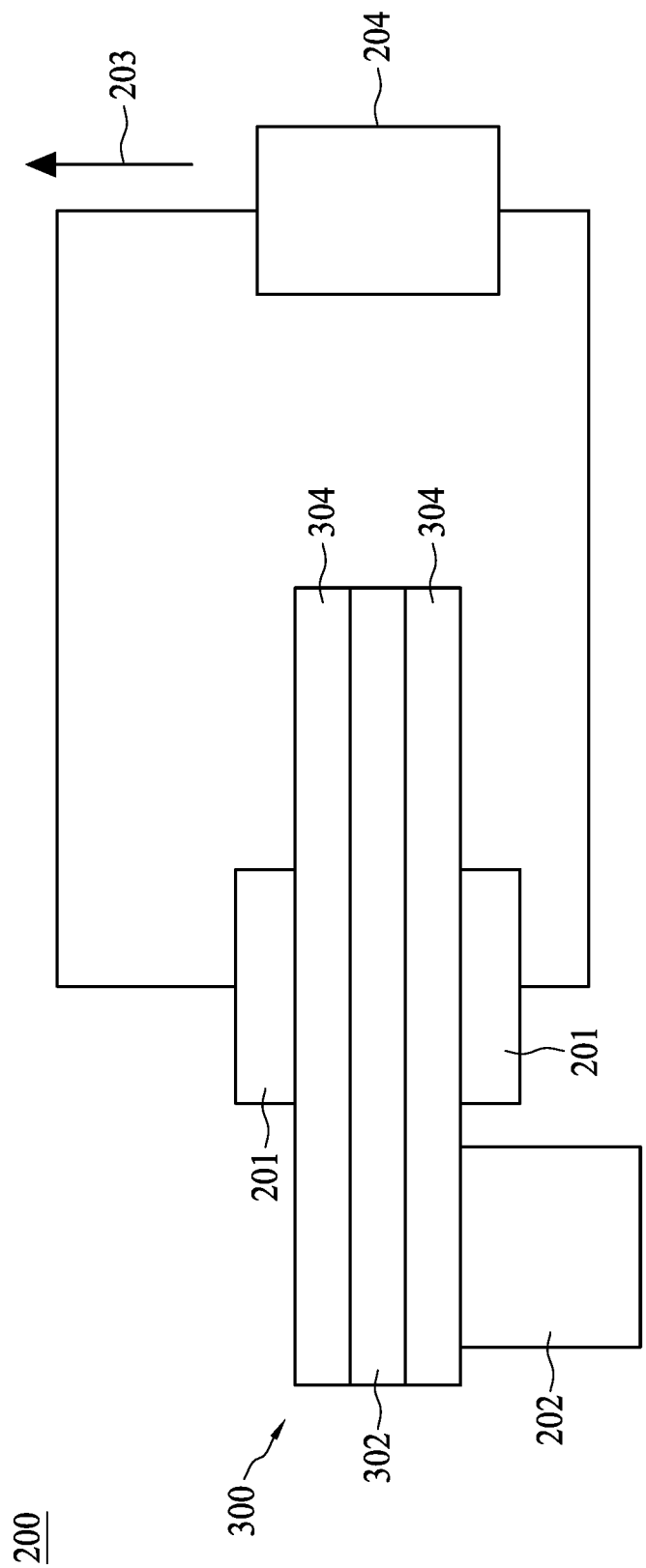
FIG. 2 is a schematic view of an apparatus for manufacturing a semiconductor device at some stages in accordance with some embodiments of the present disclosure.

FIG. 2 is a schematic view of an apparatus 200 for manufacturing a semiconductor device at some stages in accordance with some embodiments of the present disclosure. Referring to FIG. 2, the apparatus 200 includes a pedestal 202 and a power supply 204. The pedestal 202 supports a semiconductor device 300. The pedestal 202 may have a planar or substantially planar surface. In some embodiments, the pedestal 202 may be connected to an electrical ground (not shown in FIG. 2). The power supply 204 is configured to provide a voltage 203 to the semiconductor device 300. In one or more embodiments, the power supply 204 may provide the voltage 203 through two separate electrodes 201 on opposite sides of the semiconductor device 300. It should be noted that the structure of the power supply 204 is not limiting.

The semiconductor device 300 includes an intermediate layer 302. The intermediate layer 302 may be a piezoelectric or ferroelectric layer. In some embodiments, the intermediate layer 302 may be sandwiched between two metal layers 304. The semiconductor device 300 may be, but is not limited to, a Micro-Electro-Mechanical Systems (MEMS) device. In some embodiments, the semiconductor device 300 may be a fixed-fixed micro-beam device, a micro-cantilever device, a micro-switch, or other device with piezoelectric or ferroelectric layer.

In one or more embodiments, a material of the piezoelectric layer to be poled may be any suitable piezoelectric material. In some embodiments, ceramic-based piezoelectric materials may include, but are not limited to, materials such as barium titanate ($BaTiO_3$), lead zirconium titanate ($Pb(Zr_xTi_{1-x})O_3$), potassium niobate ($KNbO_3$), zinc oxide ($ZnO$), and bismuth ferrite ($BiFeO_3$). Other examples include, but are not limited to, polymer-based piezoelectric materials such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDF-TrFE. Other examples of piezoelectric materials that may be employed include polyvinylidene chloride (PVDC) homopolymers and copolymers, polytetrafluoroethylene (PTFE) homopolymers and copolymers, and diisopropylammonium bromide (DIPAB).

In one or more embodiments, a material of the ferroelectric layer to be poled may be any suitable ferroelectric material. In some embodiments, the ferroelectric layer may include hafnium dioxide ($HfO_2$), hafnium silicide oxide (HfSiOx), hafnium zirconium oxide ($HfZrO_x$), aluminium oxide ($Al_2O_3$), titanium dioxide ($TiO_2$), lanthanum oxide ($LaO_x$), barium strontium titanate oxide ($BaSrTiO_x$, BST), lead zirconate titanate oxide ($PbZrTiO_x$, PZT), or the like, wherein a value of x is greater than zero and smaller than 1.

Figure 3C:
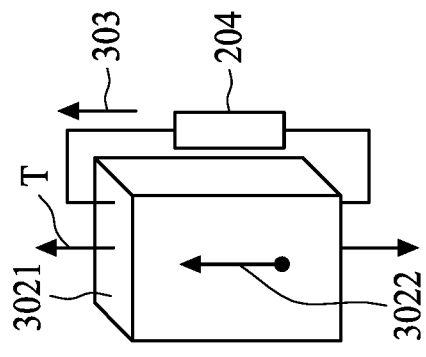
FIG. 3B and FIG. 3C are schematic views of the unit cell during the poling operation in accordance with some embodiments of the present disclosure.
Figure 3B:
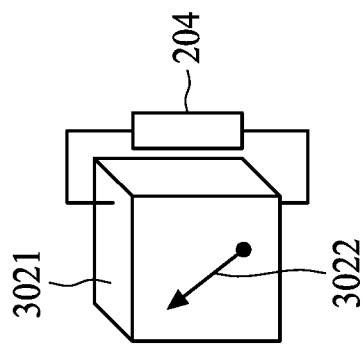
Figure 3A:
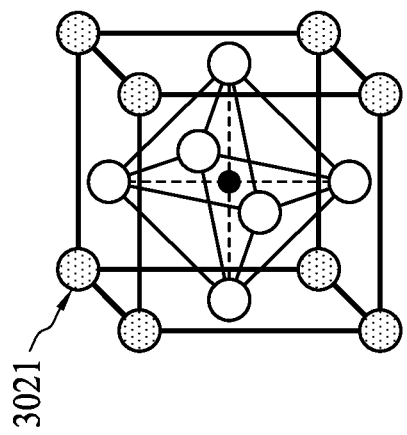
FIG. 3A is a schematic view of a unit cell of an intermediate layer in accordance with some embodiments of the present disclosure.

FIG. 3A is a schematic view of a unit cell 3021 of the intermediate layer in accordance with some embodiments of the present disclosure. FIG. 3B and FIG. 3C are schematic views of the unit cell 3021 during the poling operation in accordance with some embodiments of the present disclosure. Referring to FIG. 3A, as an example, if the material of the intermediate layer is piezoelectric material, such as lead zirconium titanate ($Pb(Zr_xTi_{1-x})O_3$), the unit cell 3021 of the intermediate layer 302 (shown in FIG. 2) may be a perovskite structure. It should be understood that the structure of the unit cell may be different than those mentioned herein, since the structure of the unit cell corresponds to the material of the intermediate layer and the description provided herein is not intended to be limiting.

Referring to FIG. 3B, in some embodiments, the unit cell 3021 may have a dipole 3022. Before the poling operation, the dipole orientation of the dipole 3022 is random. In other words, the dipole 3022 is in an unstable state and may be aligned along any imposed field (e.g., an electrical field or a magnetic field). To facilitate understanding, a single unit cell 3021 is used herein to describe the poling operation of the present disclosure. However, it should be understood that the intermediate layer 302 includes a plurality of unit cells 3021 and each unit cell 3021 has a dipole 3022.

Referring to FIG. 3C, the voltage is applied to the unit cell 3021 of the intermediate layer 302. In some embodiments, the voltage is an alternating current (AC) voltage 303. A frequency of the AC voltage 303 corresponds to a resonant frequency of the unit cell 3021 of the intermediate layer 302. The resonant frequency of the unit cell 3021 is the frequency that causes the unit cell 3021 to oscillate. In some embodiments, during the oscillation, the structure of the unit cell 3021 may alternately oscillate between a stretched condition and the initial condition. In the present example, the unit cell 3021 is stretched by the AC voltage 303. The AC voltage 303 applies an electrical energy to the unit cell 3021 of the intermediate layer 302. The electrical energy provides a tensional force T to stretch the unit cell 3021. As the unit cell 3021 is stretched, the poling operation may have a stronger effect on the unit cell 3021. Moreover, the dipole 3022 of the unit cell 3021 may reach a stable state due to the application of the AC voltage 303.

It should be understood that the operation described with respect to FIG. 2, FIG. 3A, FIG. 3B and FIG. 3C may be performed at a predetermined temperature (e.g., the Curie temperature of the intermediate layer 302) for a predetermined period for accelerating the poling operation. In other words, the semiconductor device 300 may be heated to the predetermined temperature for the predetermined period. The predetermined period may be shorter than that of an existing poling operation and the harm caused by high temperature may be alleviated.

Briefly, the dipole 3022 of the unit cell 3021 may be polarized by the AC voltage 303 and thus the intermediate layer 302 may be polarized more uniformly and efficiently by the AC voltage 303 with the resonant frequency. The intermediate layer 302 may receive the electrical energy more efficiently from the AC voltage 303 with the resonant frequency.

In summary, according to some embodiments of the present disclosure, the power supply 204 provides a voltage 203 (e.g., the AC voltage 303) corresponding to the lattice properties of the intermediate layer 302 (i.e., the piezoelectric or ferroelectric layer). For example, a frequency of the voltage 203 corresponds to a resonant frequency of the unit cells 3021 in the intermediate layer 302. The unit cells 3021 of the intermediate layer 302 may be stretched by the voltage 203 with the resonant frequency. As the unit cells 3021 are stretched, the poling operation may have a stronger effect on the intermediate layer 302. As a result, the dipoles 3022 in the intermediate layer 302 may be polarized more uniformly and efficiently when the electrical field is applied in one direction. In other words, the intermediate layer 302 may receive the electrical energy more efficiently from the voltage with the resonant frequency. Moreover, the dipoles 3022 of the unit cells 3021 in the intermediate layer 302 may reach a stable state due tot the application of the voltage 203, and the degradation issue of the intermediate layer 302 may be alleviated.

Figure 4B:
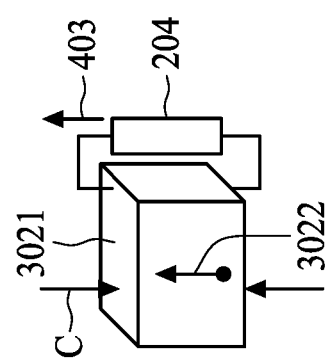
FIG. 4A and FIG. 4B are schematic views of the unit cell during the poling operation in accordance with some embodiments of the present disclosure.
Figure 4A:
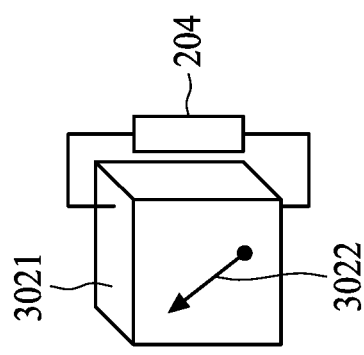

FIG. 4A and FIG. 4B are schematic views of the unit cell 3021 during the poling operation in accordance with some embodiments of the present disclosure. In the present example, a frequency of the AC voltage 403 corresponds to an anti-resonant frequency of the unit cell 3021 of the intermediate layer 302.

Referring to FIG. 4A, as described above, the unit cell 3021 includes the dipole 3022. Before the poling operation, the dipole orientation of the dipole 3022 is random. In other words, the dipole 3022 is in an unstable state and may be aligned along any imposed field (e.g., an electrical field or a magnetic field). To facilitate understanding, a single unit cell 3021 is used herein to describe the poling operation of the present disclosure. However, it should be understood that the intermediate layer 302 includes a plurality of unit cells 3021 and each unit cell 3021 has a dipole 3022.

Referring to FIG. 4B, the voltage is applied to the unit cell 3021 of the intermediate layer 302. In some embodiments, the voltage is the alternating current (AC) voltage 403. A frequency of the AC voltage 403 corresponds to an anti-resonant frequency of the unit cell 3021 of the intermediate layer 302. The anti-resonant frequency of the unit cell 3021 is the frequency that causes the unit cell 3021 to oscillate. In some embodiments, during the oscillation, the structure of the unit cell 3021 may alternately oscillate between a compressed condition and the initial condition. In the present example, the unit cell 3021 is compressed by the AC voltage 403. The AC voltage 403 applies an electrical energy to the unit cell 3021 of the intermediate layer 302. The electrical energy provides a compressive force C to compress the unit cell 3021. As the unit cell 3021 is compressed, the poling operation may have a stronger effect on the unit cell 3021. Moreover, the dipole 3022 of the unit cell 3021 may reach a stable state due to the application of the AC voltage 403.

It should be understood that the operation described with respect to FIG. 4A and FIG. 4B may be performed at a predetermined temperature (e.g., the Curie temperature of the intermediate layer) for a predetermined period for accelerating the poling operation. In other words, the semiconductor device may be heated to the predetermined temperature for the predetermined period. The predetermined period of the present disclosure may be shorter than that of an existing poling operation and the harm caused by high temperature may be alleviated.

Briefly, the dipole 3022 of the unit cell 3021 may be polarized by the AC voltage 403 and thus the intermediate layer 302 may be polarized more uniformly and efficiently by the AC voltage 403 with the anti-resonant frequency. The intermediate layer 302 may receive the electrical energy more efficiently from the AC voltage 403 with the anti-resonant frequency.

In summary, according to some embodiments of the present disclosure, the power supply 204 provides a voltage (e.g., the AC voltage 403) corresponding to the lattice properties of the intermediate layer 302 (i.e., the piezoelectric or ferroelectric layer). For example, a frequency of the voltage corresponds to an anti-resonant frequency of the unit cells 3021 of the intermediate layer 302. The unit cells 3021 of the intermediate layer 302 may be compressed by the voltage 203 with the anti-resonant frequency. As the unit cells 3021 are compressed, the poling operation may have a stronger effect on the intermediate layer 302. As a result, the dipoles 3022 in the intermediate layer 302 may be polarized more uniformly and efficiently when the electrical field is applied in one direction. In other words, the intermediate layer 302 may receive the electrical energy more efficiently from the voltage with the anti-resonant frequency. Moreover, the dipoles 3022 of the unit cells 3021 of the intermediate layer 302 may reach a stable state due to the application of the voltage 203, and the degradation issue of the intermediate layer 302 may be alleviated.

FIG. 5 is a plot of an AC voltage 503 showing impedance in relation to frequency in accordance with some embodiments of the present disclosure. FIG. 6A, FIG. 6B and FIG. 6C are schematic views of the unit cell 3021 during the poling operation in accordance with some embodiments of the present disclosure. In the present example, the AC voltage 503 may include multiple frequencies which correspond to the resonant frequency and the anti-resonant frequency of the unit cell 3021 of the intermediate layer 302.

Referring to FIG. 6A, as described above, the unit cell 3021 includes the dipole 3022. Before the poling operation, the dipole orientation of the dipole 3022 is random. To facilitate understanding, a single unit cell 3021 is used herein to describe the poling operation of the present disclosure. However, it should be understood that the intermediate layer 302 includes a plurality of unit cells 3021 and each unit cell 3021 has a dipole 3022.

Referring to FIG. 6B, the voltage is applied to the unit cell 3021 of the intermediate layer 302. In some embodiments, the voltage is the alternating current (AC) voltage 503. The AC voltage 503 may include multiple frequencies which correspond to the resonant frequency and the anti-resonant frequency of the unit cell 3021 of the intermediate layer 302. The AC voltage 503 may cause the unit cell 3021 to oscillate. In some embodiments, during the oscillation, the structure of the unit cell 3021 may oscillate in a range of a stretched condition, the initial condition and a compressed condition. In one or more embodiments, the unit cell 3021 is stretched by the AC voltage 503 during resonant frequency. The AC voltage 503 applies an electrical energy to the unit cell 3021 of the intermediate layer 302. The electrical energy provides a tensional force T to stretch the unit cell 3021.

Referring to FIG. 6C, in some embodiments, the unit cell 3021 is compressed by the AC voltage 403 during anti-resonant frequency. The AC voltage 403 applies an electrical energy to the unit cell 3021 of the intermediate layer 302. The electrical energy provides a compressive force C to compress the unit cell 3021.

As the unit cell 3021 is stretched and compressed, the poling operation may have a stronger effect on the unit cell 3021. Moreover, the dipole 3022 of the unit cell 3021 may reach a stable state due to the application of the AC voltage 403. It should be noted that the arrangement of the frequencies are not limiting, and the unit cell 3021 may first be compressed (by anti-resonant frequency) and then be stretched (by resonant frequency).

It should be understood that the operation described with respect to FIG. 5, FIG. 6A, FIG. 6B and FIG. 6C may be performed at a predetermined temperature (e.g., the Curie temperature of the intermediate layer) for a predetermined period for accelerating the poling operation. In other words, the semiconductor device may be heated to the predetermined temperature for the predetermined period. The predetermined period of the present disclosure may be shorter than that of an existing poling operation and the harm caused by high temperature may be alleviated.

Briefly, the dipole 3022 of the unit cell 3021 may be polarized by the AC voltage 503 and thus the intermediate layer 302 may be polarized more uniformly and efficiently by the AC voltage 503 with resonant frequency and the anti-resonant frequency. The intermediate layer 302 may receive the electrical energy more efficiently from the AC voltage 403 with the resonant frequency and the anti-resonant frequency.

In summary, according to some embodiments of the present disclosure, the power supply 204 provides a voltage (e.g., the AC voltage 503) corresponding to the lattice properties of the intermediate layer 302 (i.e., the piezoelectric or ferroelectric layer). For example, a frequency of the voltage corresponds to a resonant frequency and an anti-resonant frequency of the unit cells 3021 of the intermediate layer 302. The unit cells 3021 of the intermediate layer 302 may be stretched and compressed by the voltage with the resonant frequency and the anti-resonant frequency. As the unit cells 3021 are stretched or compressed, the poling operation may have a stronger effect on the intermediate layer 302. As a result, the dipoles 3022 in the intermediate layer 302 may be polarized more uniformly and efficiently when the electrical field is applied in one direction. In other words, the intermediate layer 302 may receive the electrical energy more efficiently from the voltage with the resonant frequency and the anti-resonant frequency. Moreover, the dipoles 3022 of the unit cells 3021 in the intermediate layer 302 may reach a stable state due to the application of the voltage 203, and the degradation issue of the intermediate layer 302 may be alleviated.

Figure 7:
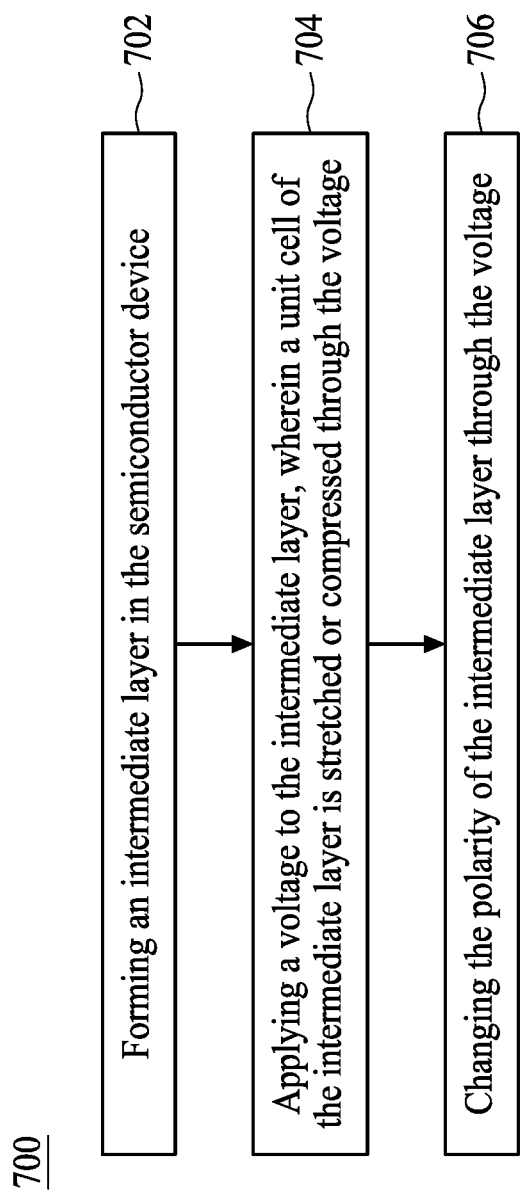
FIG. 7 is a flowchart illustrating a method for manufacturing a semiconductor device in accordance with some embodiments of the present disclosure.

FIG. 7 is a flowchart illustrating a method 700 for manufacturing a semiconductor device in accordance with some embodiments of the present disclosure. The method 700 for manufacturing a semiconductor device may include operations 702, 704 and 706. In operation 702, an intermediate layer is formed in the semiconductor device. In operation 704, a voltage is applied to the intermediate layer. A unit cell of the intermediate layer is stretched or compressed by the voltage. In operation 706, the polarity of the intermediate layer is changed by the voltage. The detailed descriptions of such operations are similar to the descriptions of the operations shown in FIG. 2, FIG. 3A, FIG. 3B, FIG. 3C, FIG. 4A, FIG. 4B, FIG. 5, FIG. 6A, FIG. 6B and FIG. 6C, and thus are omitted for brevity.

Figure 8:
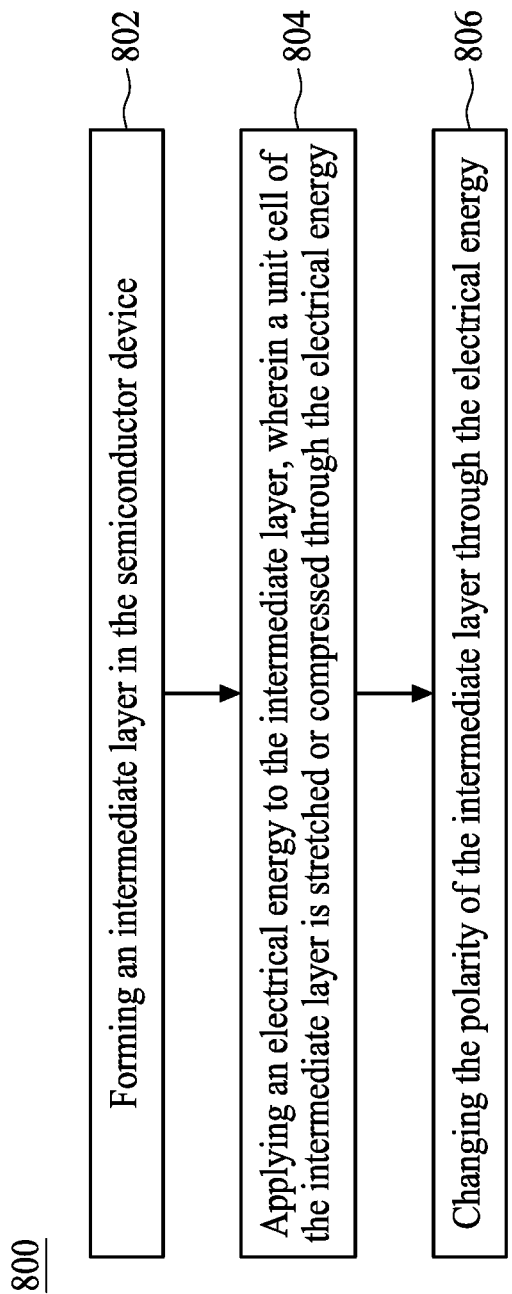
FIG. 8 is a flowchart illustrating a method for manufacturing a semiconductor device in accordance with some embodiments of the present disclosure.

FIG. 8 is a flowchart illustrating a method 800 for manufacturing a semiconductor device in accordance with some embodiments of the present disclosure. The method 800 for manufacturing a semiconductor device may include operations 802, 804 and 806. In operation 802, an intermediate layer is formed in the semiconductor device. In operation 804, an electrical energy is applied to the intermediate layer. A unit cell of the intermediate layer is stretched or compressed by the electrical energy. In operation 806, the polarity of the intermediate layer is changed by the voltage. The detailed descriptions of such operations are similar to the descriptions of the operations shown in FIG. 2, FIG. 3A, FIG. 3B, FIG. 3C, FIG. 4A, FIG. 4B, FIG. 5, FIG. 6A, FIG. 6B and FIG. 6C, and thus are omitted for brevity.

Figure 9:
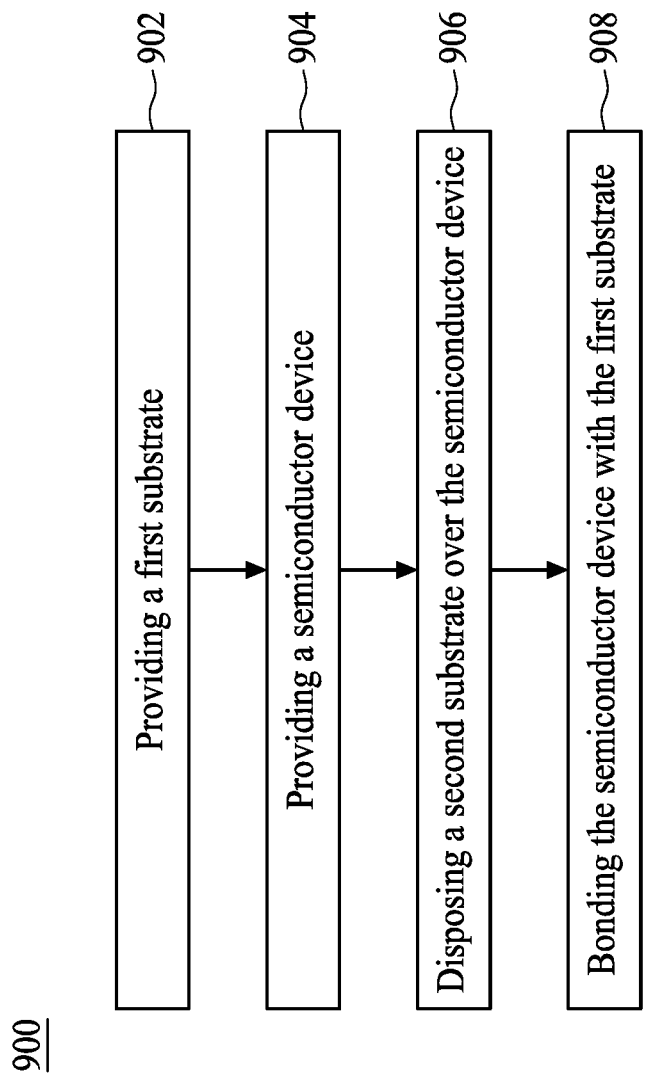
FIG. 9 is a flowchart illustrating a method 900 for manufacturing a semiconductor structure in accordance with some embodiments of the present disclosure.

FIG. 9 is a flowchart illustrating a method 900 for manufacturing a semiconductor structure in accordance with some embodiments of the present disclosure. The method 900 for manufacturing a semiconductor structure may include operations 902, 904, 906 and 908. In operation 902, a first substrate is provided or received. In some embodiments, the first substrate is fabricated with a predetermined functional circuit thereon. The first substrate may include several electrical components or circuitries disposed over the first substrate. In some embodiments, the first substrate is an interposer or a wafer. In some embodiments, the first substrate includes semiconductive material such as silicon, germanium, gallium, arsenic or etc. In other embodiments, the first substrate is a CMOS substrate which includes CMOS components electrically connected to the circuitries in the CMOS substrate.

In operation 904, a semiconductor device is provided or received. In some embodiments, the semiconductor device includes an intermediate layer. The semiconductor device may be a MEMS device. The intermediate layer may be a piezoelectric or ferroelectric layer. The semiconductor device may be formed by the method 700 or 800 described in FIG. 7 and FIG. 8. The detailed descriptions of method 700 or 800 are similar to the descriptions of the operations shown in FIG. 2, FIG. 3A, FIG. 3B, FIG. 3C, FIG. 4A, FIG. 4B, FIG. 5, FIG. 6A, FIG. 6B and FIG. 6C, and thus are omitted for brevity.

In operation 906, a second substrate is disposed over the semiconductor device. In some embodiments, the second substrate is disposed over or bonded with the semiconductor device. In some embodiments, the second substrate is a capping wafer. In some embodiments, the second substrate includes silicon, glass, etc. In some embodiments, the second substrate is a silicon substrate or a glass substrate.

In operation 908, the semiconductor device is bonded with the first substrate. In some embodiments, the semiconductor device is bonded with the first substrate by eutectic bonding or any other suitable operations. In some embodiments, the semiconductor structure is formed.

It should be noted that the poling operations shown in FIG. 2, FIG. 3A, FIG. 3B, FIG. 3C, FIG. 4A, FIG. 4B, FIG. 5, FIG. 6A, FIG. 6B and FIG. 6C may be applied to the intermediate layer during or after the manufacturing of the semiconductor structure.

In summary, according to some embodiments of the present disclosure, the power supply provides a voltage corresponding to the lattice properties of the intermediate layer (i.e., the piezoelectric or ferroelectric layer). For example, a frequency of the voltage corresponds to a resonant frequency and/or an anti-resonant frequency of the unit cells in the intermediate layer. The unit cells of the intermediate layer may be stretched and/or compressed by the voltage with the resonant frequency and/or the anti-resonant frequency. As the unit cells are stretched or compressed, the poling operation may have a stronger effect on the intermediate layer. As a result, the dipoles in the intermediate layer 302 may be polarized more uniformly and efficiently when the electrical field is applied in one direction. In other words, the intermediate layer may receive the electrical energy more efficiently from the voltage with the resonant frequency and the anti-resonant frequency. Moreover, the dipoles of the unit cells in the intermediate layer may reach a stable state due to application of the voltage, and the degradation issue of the intermediate layer may be alleviated.

According to some embodiments, a method for manufacturing a semiconductor device is provided. The method for manufacturing a semiconductor device includes the following operations. An intermediate layer is formed in the semiconductor device. A voltage is applied to the intermediate layer. A unit cell of the intermediate layer is stretched or compressed by the voltage. The polarity of the intermediate layer is changed by the voltage.

According to other embodiments, a method for manufacturing a semiconductor device is provided. The method for manufacturing a semiconductor device includes the following operations. An intermediate layer is formed in a semiconductor device. An electrical energy is applied to the intermediate layer. A unit cell of the intermediate layer is stretched or compressed by the electrical energy. The polarity of the intermediate layer is changed by the electrical energy.

According to other embodiments, an apparatus for manufacturing a semiconductor device is provided. The apparatus includes a pedestal and a power supply. The pedestal supports a semiconductor device. The semiconductor device has an intermediate layer. The power supply provides a voltage to the semiconductor device. A unit cell of the intermediate layer is stretched or compressed by the voltage and the polarity of the intermediate layer is changed by the voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming an intermediate layer in the semiconductor device;
   applying an alternating current (AC) voltage to the intermediate layer, wherein a unit cell of the intermediate layer is stretched or compressed by the voltage; and
   changing the polarity of the intermediate layer by the voltage,
   wherein a frequency of the AC voltage corresponds to an anti-resonant frequency of the unit cell.

2. The method of claim 1, wherein the frequency of the AC voltage further corresponds to a resonant frequency of the unit cell.

3. The method of claim 2, wherein the AC voltage causes the unit cell to oscillate.

4. The method of claim 3, wherein the electrical energy provides a tensional force to stretch the unit cell.

5. The method of claim 1, further comprising:
   disposing a second substrate over the semiconductor device.

6. The method of claim 5, further comprising:
   bonding the semiconductor device to a first substrate.

7. The method of claim 6, wherein the bonding of the semiconductor device to the first substrate comprising:
   fabricating a predetermined functional circuit on the first substrate.

8. The method of claim 5, wherein the second substrate is a capping wafer.

9. The method of claim 1, further comprising:
   heating the semiconductor device to a predetermined temperature.

10. The method of claim 9, wherein the predetermined temperature is a Curie temperature of the intermediate layer.

11. A method for manufacturing a semiconductor device, comprising:
    forming an intermediate layer in a semiconductor device;
    applying an electrical energy to the intermediate layer, wherein a unit cell of the intermediate layer is stretched or compressed by the electrical energy; and
    changing the polarity of the intermediate layer by the electrical energy,
    wherein a frequency of the electrical energy corresponds to an anti-resonant frequency of the unit cell.

12. The method of claim 11, wherein the electrical energy provides a compressive force to compress the unit cell.

13. The method of claim 11, wherein the intermediate layer includes a piezoelectric or ferroelectric layer.

14. The method of claim 11, wherein the frequency of the electrical energy further corresponds to a resonant frequency of the unit cell.

15. The method of claim 14, wherein the electrical energy causes the unit cell to oscillate.

16. An apparatus for manufacturing a semiconductor device, comprising:
    a pedestal for supporting a semiconductor device, wherein the semiconductor device has an intermediate layer; and
    a power supply for providing an alternating current (AC) voltage to the semiconductor device,
    wherein a unit cell of the intermediate layer is stretched or compressed by the voltage and the polarity of the intermediate layer is changed by the voltage,
    wherein a frequency of the AC voltage corresponds to an anti-resonant frequency of the unit cell.

17. The apparatus of claim 16, wherein the frequency of the AC voltage further corresponds to a resonant frequency of the unit cell.

18. The apparatus of claim 17, wherein the unit cell is stretched by the AC voltage with the resonant frequency of the unit cell.

19. The apparatus of claim 16, wherein the unit cell is compressed by the AC voltage with the anti-resonant frequency of the unit cell.

20. The apparatus of claim 17, wherein the AC voltage causes the unit cell to oscillate.

* * * * *